(12) United States Patent
Kim

(10) Patent No.: US 7,588,978 B2
(45) Date of Patent: Sep. 15, 2009

(54) METHOD FOR FORMING SEMICONDUCTOR DEVICE

(75) Inventor: Jea-Hee Kim, Gyeonggi-do (KR)

(73) Assignee: Dongbu HiTek, Co., Ltd., Seoul (KR)

( * ) Notice: Subject to any disclaimer, the term of this patent is extended or adjusted under 35 U.S.C. 154(b) by 197 days.

(21) Appl. No.: 11/846,859

(22) Filed: Aug. 29, 2007

(65) Prior Publication Data

US 2008/0064192 A1    Mar. 13, 2008

(30) Foreign Application Priority Data

Sep. 13, 2006    (KR) ...................... 10-2006-0088423

(51) Int. Cl.
*H01L 21/8238* (2006.01)
*H01L 21/8234* (2006.01)

(52) U.S. Cl. ...................... 438/200; 438/224; 438/228; 438/275

(58) Field of Classification Search ................. 438/200, 438/224, 228, 275
See application file for complete search history.

(56) References Cited

U.S. PATENT DOCUMENTS

| | | | |
|---|---|---|---|
| 6,440,798 B1 | 8/2002 | Lai et al. | 438/266 |
| 6,927,114 B2 | 8/2005 | Park | 438/200 |
| 7,067,365 B1 | 6/2006 | Lee et al. | 438/197 |
| 7,138,314 B2 | 11/2006 | Song et al. | 438/258 |
| 2007/0032027 A1 | 2/2007 | Shin et al. | 438/302 |

*Primary Examiner*—Luan C Thai
(74) *Attorney, Agent, or Firm*—Sherr & Vaughn, PLLC

(57) ABSTRACT

Embodiments relate to a method for forming a semiconductor device in which a first oxide layer may be deposited over a surface of a semiconductor substrate including high-voltage (HV) and low-voltage (LV) wells, the first oxide layer having a predetermined thickness corresponding to a high-voltage (HV) area of the well. A first photoresist pattern may be formed over a surface of the first oxide layer. An etching process may be performed using the first photoresist pattern as a mask, so that the first oxide layer is selectively etched until the semiconductor substrate is partially exposed, to form a first oxide layer pattern. A second oxide layer may be deposited over a surface of the semiconductor substrate including the first oxide layer pattern using the first photoresist pattern as a mask, the second oxide layer having a predetermined thickness corresponding to a low-voltage (LV) area of the well. The first photoresist pattern may be removed. A polysilicon layer may be coated over the surface of the semiconductor substrate including the first oxide layer pattern and the second oxide layer. A second photoresist pattern may be formed over a surface of the polysilicon layer. An etching process may be performed using the second photoresist pattern as a mask, so that the polysilicon layer is selectively etched until the first oxide layer pattern and the second oxide layer are partially exposed. The second photoresist pattern may be removed. An impurity ion-implantation process may be performed using the polysilicon layer, the first oxide layer pattern and the second oxide layer as a hard mask, to form a drift area in the semiconductor substrate.

10 Claims, 3 Drawing Sheets

METHOD FOR FORMING SEMICONDUCTOR DEVICE

The present application claims priority under 35 U.S.C. 119 to Korean Patent Application No. 10-2006-0088423, filed on Sep. 13, 2006, which is hereby incorporated by reference in its entirety.

BACKGROUND

A semiconductor device may use a voltage of 3.3V or less as a power-supply voltage, to minimize power consumption and maximize reliability. However, the semiconductor device may be connected to other peripheral devices in a single system. Since a peripheral device may use a voltage of 5V or more as the power-supply, a semiconductor device may include a high-voltage element for supporting a high input voltage received from an external part.

A high-voltage element may have the same structure as that of a MOS element (i.e., a low-voltage element), and may be simultaneously integrated with a low-voltage element according to a predetermined fabrication process. A related method for manufacturing the semiconductor device including the high-voltage element will hereinafter be described in detail.

Impurities may be implanted using an ion implantation process to form a high-voltage (HV) N-well and a high-voltage (HV) P-well, a low-voltage (LV) N-well, and a low-voltage (LV) P-well in a semiconductor substrate. Impurities may be implanted using an ion implantation process to form a N-drift area and a P-drift area over the high-voltage P- and N-wells contained in the surface of semiconductor substrate.

A shallow trench isolation (STI) mask for exposing a shallow trench isolation (STI) area on the semiconductor substrate may be formed according to a LOCOS process. Ion-implantation may be used to form a channel stop. Field oxide layers may be formed in the STI layer of the semiconductor substrate using a thermal oxidation process.

Ion implantation may be employed to adjust threshold voltages of high-voltage PMOS and low-voltage NMOS/PMOS. A gate oxide layer for high-voltage or low-voltage elements may be formed, and a gate conductive layer is deposited and patterned to form the gate electrode.

A lightly doped drain (LDD) area may be formed in the low-voltage NMOS/PMOS by an ion implantation process. Also, a source/drain area may be formed in the high-voltage and low-voltage elements. Several post-processes including a process for forming a contact and a metal wiring layer may be executed.

Figure 1:
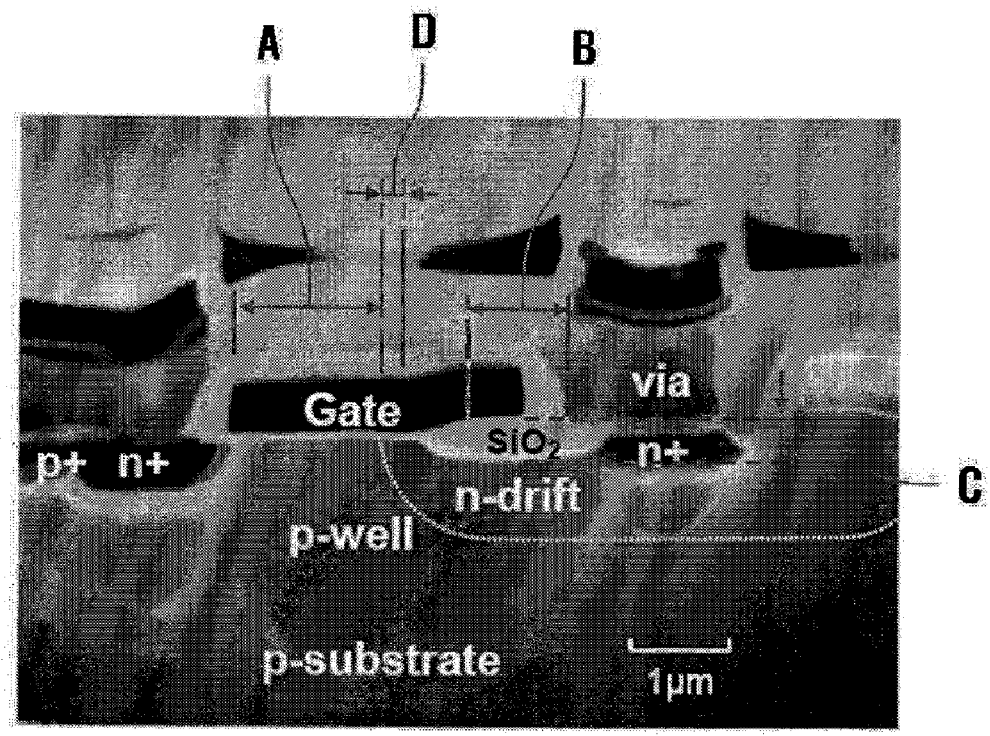

FIG. 1 is an image of a semiconductor device obtained by an ESM (Electron scanning microscope). If an EDMOS (Extended Drain MOS) for use in a high-voltage element is manufactured by the LOCOS process, it may be difficult to control distance A, a thin voltage channel size B, and a well barrier D as shown in FIG. 1. The adjustment of a locos-fox thickness C may be considered to be a critical variable.

The most important aspect of the locos-fox thickness C may be to always maintain a constant thickness for a gate oxide layer. The reference character "B" indicates a channel size. All transistors may vary in channel size.

If the well-barrier size (D) is small, a well breakdown voltage may cause unexpected problems. If the well-barrier size (D) is large, short channels may be created since the distance "A" may become shorter. A bird beak phenomenon may occur due to the difficulties with adjusting the A, B, C, and D sizes, resulting in an increased channel size.

SUMMARY

Embodiments relate to a method for forming a semiconductor device to prevent a bird beak phenomenon from being generated in a semiconductor device.

Embodiments relate to a method for forming a semiconductor device in which a first oxide layer may be deposited over a surface of a semiconductor substrate including high-voltage (HV) and low-voltage (LV) wells, the first oxide layer having a predetermined thickness corresponding to a high-voltage (HV) area of the well. A first photoresist pattern may be formed over a surface of the first oxide layer. An etching process may be performed using the first photoresist pattern as a mask, so that the first oxide layer is selectively etched until the semiconductor substrate is partially exposed, to form a first oxide layer pattern. A second oxide layer may be deposited over a surface of the semiconductor substrate including the first oxide layer pattern using the first photoresist pattern as a mask, the second oxide layer having a predetermined thickness corresponding to a low-voltage (LV) area of the well. The first photoresist pattern may be removed. A polysilicon layer may be coated over the surface of the semiconductor substrate including the first oxide layer pattern and the second oxide layer. A second photoresist pattern may be formed over a surface of the polysilicon layer. An etching process may be performed using the second photoresist pattern as a mask, so that the polysilicon layer is selectively etched until the first oxide layer pattern and the second oxide layer are partially exposed. The second photoresist pattern may be removed. An impurity ion-implantation process may be performed using the polysilicon layer, the first oxide layer pattern and the second oxide layer as a hard mask, to form a drift area in the semiconductor substrate.

The thickness of the high voltage region may be about 100~200 Å. The thickness of the low voltage may be about 300~400 Å. In the impurity ion implantation process N-impurity ions or P-impurity ions may be implanted. The drift area may be formed of an N-drift area or P-drift area by the impurity ion implantation process.

DRAWINGS

FIG. 1 is an ESM (Electron scanning microscope) photo-image of a semiconductor device.

Example FIGS. 2A~2F are cross-sectional views illustrating a method for forming a semiconductor device according to embodiments.

DESCRIPTION

Example FIGS. 2A~2F are cross-sectional views illustrating a method for forming a semiconductor device according to embodiments. Referring to example FIG. 2A, a first oxide layer 202 having a predetermined thickness corresponding to that of a high-voltage (HV) area 200 of a well in the semiconductor substrate may be formed over a surface of semiconductor substrate. A first photoresist pattern 204 may be formed over the surface of the first oxide layer 202. The etching process may be executed using the first photoresist pattern 204 as a mask, so that the first oxide layer 202 may be selectively etched until the semiconductor substrate 200 is partially exposed. Accordingly, the first oxide layer pattern 202a may be formed as shown in example FIG. 2B.

Figure 2A:
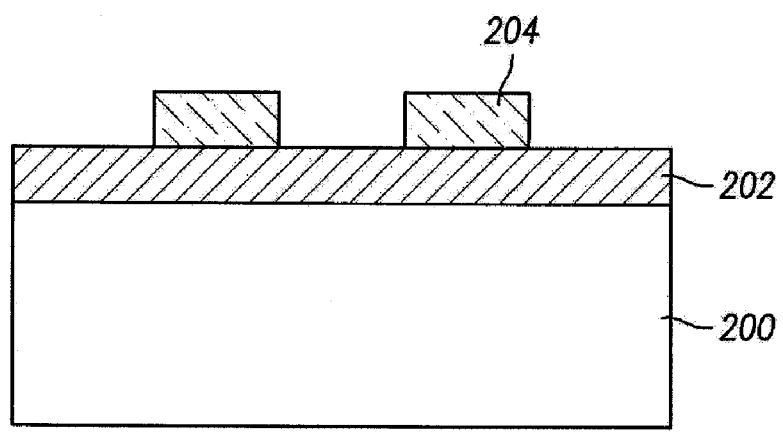
Figure 2B:
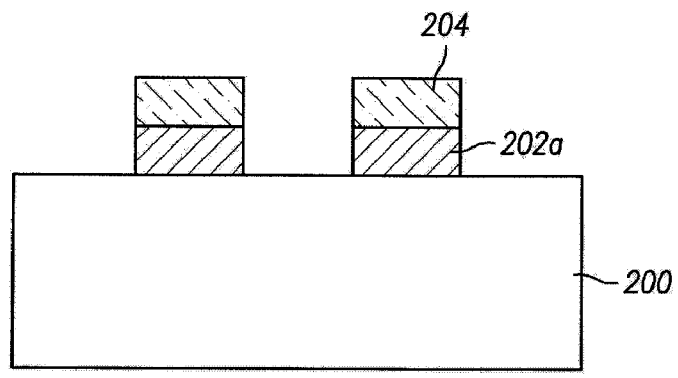
Figure 2C:
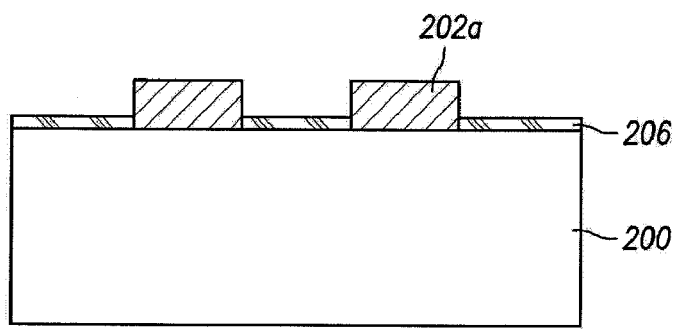
Figure 2D:
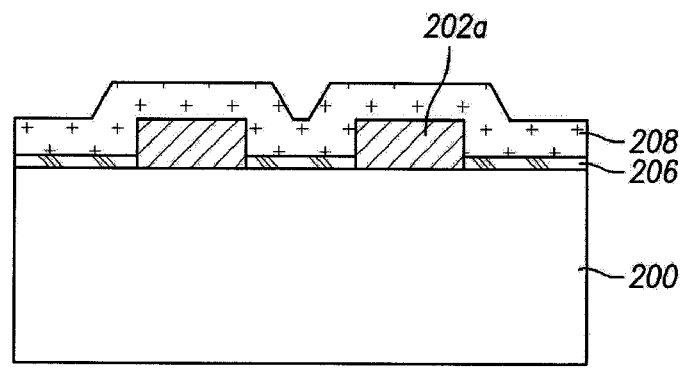

Thereafter, as shown in example FIG. 2C, the second oxide layer 206 having a thickness corresponding to that of a low-voltage (LV) area may be coated using the first photoresist pattern 204 as a mask. In this case, the oxide layer pattern 202a corresponding to the HV area and the second oxide layer 206 corresponding to the LV area may be formed.

The first photoresist pattern 204 may be removed by an etching/cleaning process. As shown in example FIG. 2D, a polysilicon layer 208 may be coated over the surface of the semiconductor substrate 200 including the oxide layer pattern 202a and the second oxide layer 206, and a second photoresist pattern 210 is then formed (see FIG. 2E).

Figure 2E:
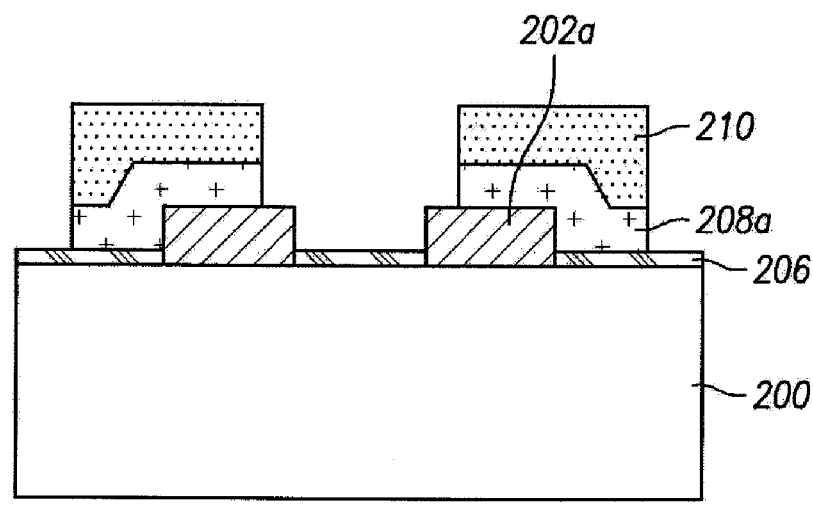

Thereafter, as shown in example FIG. 2E, an etching process (e.g., RIE process) using the second photoresist pattern 210 as a mask may be performed, the polysilicon layer 208 may be selectively etched to expose a portion of the first oxide layer pattern 202a and the second oxide layer pattern 206. The second photoresist pattern 210 may then be removed by an etching/cleaning process.

Figure 2F:
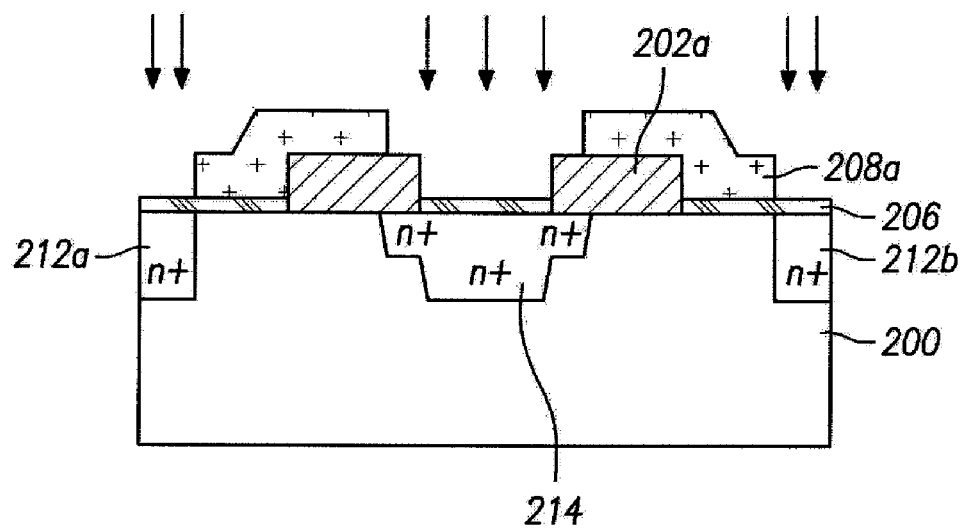

As shown in example FIG. 2F, an ion implantation process may be performed using the first oxide layer pattern 202a and the polysilicon pattern 208 as a hard mask. N+ impurity ions may be implanted in the semiconductor substrate 200, to form the N-drift area.

As apparent from the above description, the method for forming a semiconductor device according to embodiments forms an oxide layer corresponding to a high or low voltage over a semiconductor substrate, maximizing device reliability. The embodiments may prevent a well breakdown voltage caused by a minimized well-barrier size from being generated. The embodiments may prevent a bird beak phenomenon in the semiconductor from being generated.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   depositing a first oxide layer over a surface of a semiconductor substrate including high voltage and low voltage wells, the first oxide layer having a predetermined thickness corresponding to a high voltage area of the well;
   forming a first photoresist pattern over a surface of the first oxide layer, performing an etching process using the first photoresist pattern as a mask, so that the first oxide layer is selectively etched until the semiconductor substrate is partially exposed, to form a first oxide layer pattern;
   depositing a second oxide layer over a surface of the semiconductor substrate including the first oxide layer pattern using a first photoresist pattern as a mask, the second oxide layer having a predetermined thickness corresponding to a low voltage area of the well;
   removing said first photoresist pattern, and coating a polysilicon layer over the surface of the semiconductor substrate including the first oxide layer pattern and the second oxide layer;
   forming a second photoresist pattern over a surface of the polysilicon layer, performing an etching process using the second photoresist pattern as a mask, so that the polysilicon layer is selectively etched until the first oxide layer pattern and the second oxide layer are partially exposed; and
   removing the second photoresist pattern, performing an impurity ion implantation process using the polysilicon layer, the first oxide layer pattern, and the second oxide layer as a hard mask, to form a drift area in the semiconductor substrate.

2. The method of claim 1, wherein the thickness corresponding to a high voltage is about 100 Å to 200 Å.

3. The method of claim 1, wherein the thickness corresponding to a low voltage is about 300 Å to 400 Å.

4. The method of claim 1, wherein in the impurity ion implantation process N-impurity ions or P-impurity ions are implanted.

5. The method of claim 1, wherein the drift area is formed of an N-drift area or P-drift area by the impurity ion implantation.

6. A apparatus configured to:
   deposit a first oxide layer over a surface of a semiconductor substrate including high voltage and low voltage wells, the first oxide layer having a predetermined thickness corresponding to a high voltage area of the well;
   form a first photoresist pattern over a surface of the first oxide layer, perform an etching process using the first photoresist pattern as a mask, so that the first oxide layer is selectively etched until the semiconductor substrate is partially exposed, to form a first oxide layer pattern;
   deposit a second oxide layer over a surface of the semiconductor substrate including the first oxide layer pattern using a first photoresist pattern as a mask, the second oxide layer having a predetermined thickness corresponding to a low voltage area of the well;
   remove said first photoresist pattern, and coat a polysilicon layer over the surface of the semiconductor substrate including the first oxide layer pattern and the second oxide layer;
   form a second photoresist pattern over a surface of the polysilicon layer, perform an etching process using the second photoresist pattern as a mask, so that the polysilicon layer is selectively etched until the first oxide layer pattern and the second oxide layer are partially exposed; and
   remove the second photoresist pattern, perform an impurity ion implantation process using the polysilicon layer, the first oxide layer pattern, and the second oxide layer as a hard mask, to form a drift area in the semiconductor substrate.

7. The apparatus of claim 6, wherein the thickness corresponding to a high voltage is about 100 Å to 200 Å.

8. The apparatus of claim 6, wherein the thickness corresponding to a low voltage is about 300 Å to 400 Å.

9. The apparatus of claim 6, wherein in the impurity ion implantation process N-impurity ions or P-impurity ions are implanted.

10. The apparatus of claim 6, wherein the drift area is formed of an N-drift area or P-drift area by the impurity ion implantation.

* * * * *